(12) United States Patent
Zhang

(10) Patent No.: US 9,356,123 B2
(45) Date of Patent: May 31, 2016

(54) MANUFACTURING METHOD OF LOW TEMPERATURE POLYCRYSTALLINE SILICON THIN FILM AND MANUFACTURING METHOD OF THIN FILM TRANSISTOR

(71) Applicant: Huijuan Zhang, Beijing (CN)

(72) Inventor: Huijuan Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/355,137

(22) PCT Filed: Jun. 6, 2013

(86) PCT No.: PCT/CN2013/076884
§ 371 (c)(1),
(2) Date: Apr. 29, 2014

(87) PCT Pub. No.: WO2014/153841
PCT Pub. Date: Oct. 2, 2014

(65) Prior Publication Data
US 2015/0155369 A1     Jun. 4, 2015

(30) Foreign Application Priority Data

Mar. 29, 2013  (CN) .......................... 2013 1 0108582

(51) Int. Cl.
*H01L 21/00*     (2006.01)
*H01L 21/84*     (2006.01)
(Continued)

(52) U.S. Cl.
CPC .... *H01L 29/66765* (2013.01); *H01L 21/02043* (2013.01); *H01L 21/0262* (2013.01); *H01L 21/02488* (2013.01); *H01L 21/02532* (2013.01);
(Continued)

(58) Field of Classification Search
CPC ..................................................... H01L 21/324
USPC .................................................. 438/324, 158
See application file for complete search history.

(56) References Cited

U.S. PATENT DOCUMENTS 4,358,326 A * 11/1982 Doo ............................. 438/585
5,773,329 A *  6/1998 Kuo ..................... H01L 21/2022
                                                            148/DIG. 16
(Continued)

FOREIGN PATENT DOCUMENTS

CN     1738061 A        2/2006
CN   102978590 A   *    3/2013
KR   960004902 B1  *    4/1996

OTHER PUBLICATIONS

International Search Report for International Application No. PCT/CN2013/076884, 12pgs.

(Continued)

*Primary Examiner* — Matthew Landau
*Assistant Examiner* — Igwe U Anya

(57) ABSTRACT

A manufacturing method of a low temperature polycrystalline silicon thin film and a manufacturing method of a thin film transistor are provided. The manufacturing method of the low temperature polycrystalline silicon thin film comprises: forming an amorphous silicon thin film on a substrate; and performing a rapid thermal annealing (RTA) process on the amorphous silicon thin film for several times at a predetermined temperature to form the low temperature polycrystalline silicon thin film, wherein the predetermined temperature is lower than a conventional RTA crystallization temperature.

11 Claims, 4 Drawing Sheets

(51) Int. Cl.
*H01L 29/66* (2006.01)
*H01L 21/02* (2006.01)
*H01L 29/786* (2006.01)
*H01L 21/265* (2006.01)
*H01L 21/324* (2006.01)

(52) U.S. Cl.
CPC .... *H01L 21/02592* (2013.01); *H01L 21/02667* (2013.01); *H01L 21/265* (2013.01); *H01L 21/324* (2013.01); *H01L 29/66757* (2013.01); *H01L 29/78675* (2013.01)

(56) References Cited

U.S. PATENT DOCUMENTS

| | | | |
|---|---|---|---|
| 6,241,817 B1 | 6/2001 | Jang et al. | |
| 6,294,442 B1 * | 9/2001 | Kamal | H01L 21/28035 257/E21.133 |
| 6,320,784 B1 * | 11/2001 | Muralidhar | H01L 29/7887 257/E29.301 |
| 6,432,757 B1 * | 8/2002 | Noguchi et al. | 438/166 |
| 2004/0132293 A1 * | 7/2004 | Takayama | H01L 21/268 438/689 |
| 2004/0147139 A1 * | 7/2004 | Jiang | 438/795 |
| 2005/0035103 A1 * | 2/2005 | Partlo et al. | 219/121.73 |
| 2008/0277666 A1 * | 11/2008 | Jeon et al. | 257/66 |
| 2009/0170248 A1 * | 7/2009 | Kim et al. | 438/166 |
| 2012/0235152 A1 * | 9/2012 | Ota et al. | 257/66 |

OTHER PUBLICATIONS

First Office Action from State Intellectual Property Office of the People's Republic of China in Chinese Application No. CN201310108582.0; issued Apr. 3, 2015; 6 pgs.

English translation of First Office Action from State Intellectual Property Office of the People's Republic of China in Chinese Application No. CN201310108582.0; issued Apr. 3, 2015; 6 pgs.

* cited by examiner

MANUFACTURING METHOD OF LOW TEMPERATURE POLYCRYSTALLINE SILICON THIN FILM AND MANUFACTURING METHOD OF THIN FILM TRANSISTOR

CROSS REFERENCE TO RELATED APPLICATIONS

This application is based on International Application No. PCT/CN2013/076884 filed on Jun. 6, 2013, which claims priority to Chinese National Application No. 201310108582.0 filed on Mar. 29, 2013. The entire contents of each and every foregoing application are incorporated herein by reference.

TECHNICAL FIELD

Embodiments of the invention relate to a manufacturing method of a low temperature polycrystalline silicon thin film and a manufacturing method of a thin film transistor.

BACKGROUND

Due to regular atomic arrangement, high carrier mobility (10-300 $cm^2/Vs$) and high drive current, low temperature polycrystalline silicon (LTPS) accelerates the response of liquid crystal, shortens the volume of thin film transistor (TFT) and increases the light transmission area of pixel so that higher brightness and higher resolution can be obtained. Therefore, the LTPS is widely adopted in the thin film transistor to form an active layer.

In a conventional method of realizing crystallization of amorphous silicon by a rapid thermal annealing (RTA) process to form polycrystalline silicon, the RTA is performed under a temperature range around 750° C. However, a softening temperature of a normal glass substrate is about 700° C., and thus the crystallization of amorphous silicon cannot be performed on the normal glass substrate. In addition, in the case of high-temperature crystallization, crystal nucleus is excessive, which is not favorable for the formation of crystal gains with large size. In addition, the high-temperature crystallization increases the internal stress of a film, which results in more crystal defects.

Therefore, the polycrystalline silicon thin film formed by the conventional RTA process is small in size, uneven in distribution and high in film roughness, which will result in the decline of the electric properties (such as mobility, leakage current, mobility uniformity, uniformity of threshold voltage, etc.) of the low temperature polycrystalline silicon thin film transistor.

SUMMARY

According to some embodiments, a manufacturing method of a low temperature polycrystalline silicon thin film is provided. The method comprises: forming an amorphous silicon thin film on a substrate; and performing a rapid thermal annealing (RTA) process on the amorphous silicon thin film for several times at a predetermined temperature to form the low temperature polycrystalline silicon thin film, wherein the predetermined temperature is lower than a conventional RTA crystallization temperature.

According to some embodiments, a manufacturing method of a thin film transistor is provided. The method comprises: forming a buffer layer on a substrate; forming a low temperature polycrystalline silicon thin film on the buffer layer by using a method as described above; patterning the low temperature polycrystalline silicon thin film to form an active layer comprising a source region, a drain region and a channel region; forming a gate insulation layer on the channel region, and forming a gate electrode on the gate insulation layer; doping impurities into the source region and the drain region by an ion implantation method, and forming an interlayer insulation layer on the gate electrode; and forming a source electrode and a drain electrode on the substrate on which the interlayer insulation layer has been formed.

According to some embodiments, a manufacturing method of a thin film transistor is provided. The method comprises: forming a buffer layer on a substrate; forming a gate electrode on the buffer layer, and forming a gate insulation layer on the gate electrode; forming a low temperature polycrystalline silicon thin film on the gate insulation layer by using a method as described above; patterning the low temperature polycrystalline silicon thin film to form an active layer comprising a source region, a drain region and a channel region; doping impurities into the source region and the drain region by an ion implantation method, and forming an interlayer insulation layer on the active layer; and forming a source electrode and a drain electrode on the substrate on which the interlayer insulation layer has been formed.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiments of the invention provide a manufacturing method of a low temperature polycrystalline silicon thin film and a manufacturing method of a thin film transistor, which can form a uniform polycrystalline silicon thin film having a high mobility on a normal glass substrate so that the electric properties of the thin film transistor can be improved.

Figure 1:
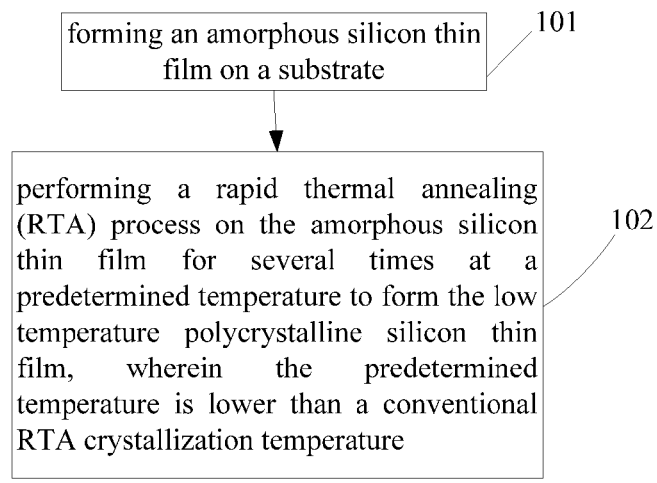
FIG. 1 is a flowchart illustrating a manufacturing method of a low temperature polycrystalline silicon thin film according to embodiments of the invention.

FIG. 1 is a flowchart illustrating a manufacturing method of a low temperature polycrystalline silicon thin film according to an embodiment of the invention. As shown in FIG. 1, the method comprises:

Step 101: forming an amorphous silicon thin film on a substrate;

Step 102: performing a rapid thermal annealing (RTA) process on the amorphous silicon thin film for several times at a predetermined temperature to form the low temperature polycrystalline silicon thin film, wherein the predetermined temperature is lower than a conventional RTA crystallization temperature.

The conventional RTA crystallization temperature is 750° C.

Furthermore, in an example, the substrate is cleaned before the step 101 so as to keep it clean.

Furthermore, in an example, the step 101 comprises: forming a buffer layer on the substrate; and depositing the amorphous silicon thin film on the buffer layer by a plasma enhanced chemic vapor deposition (PECVD) method.

Furthermore, in an example, the step 102 comprises: performing the rapid thermal annealing process on the amorphous silicon thin film for at least three times under a temperature range of 600-670° C., wherein the rapid thermal annealing process at each time is performed for no more than 30 s and is followed by a cooling process to cool the substrate to a room temperature.

Furthermore, in an example, before the step 102 is performed, the method further comprises: performing a thermal treatment on the amorphous silicon thin film for 1-2 hours under a temperature range of 400-500° C.

Furthermore, in an example, after the step 102 is performed, the method further comprises: performing a thermal treatment on the low temperature polycrystalline silicon thin film for at least 3 hours under a temperature range of 400-500° C.

The conventional crystallization by the RTA process undergoes the annealing under the temperature range around 750° C. However, the softening temperature of the normal glass substrate is about 700° C., and thus the crystallization of the amorphous silicon cannot be performed on the normal glass substrate. In addition, in the case of high-temperature crystallization, crystal nucleus is excessive, which is not favorable for the formation of the crystal gains with large size. In addition, the high-temperature crystallization increases the internal stress of the film, which results in more crystal defects.

The manufacturing method of the low temperature polycrystalline silicon thin film according to the embodiment of the invention performs the rapid thermal annealing process on the amorphous silicon thin film for several time under the temperature lower than the conventional RTA crystallization temperature, so that the crystallization temperature can be reduced, the crystallization can be performed on the normal glass substrate and the manufacturing cost of the low temperature polycrystalline silicon thin film can be decreased. In addition, by performing the rapid thermal annealing processes for several times under the temperature lower than the conventional RTA crystallization temperature, the crystal grains of the polycrystalline silicon thin film becomes uniform and the internal stress of the polycrystalline silicon thin film is decreased, so that the crystal defect of the polycrystalline silicon thin film can be reduced, the mobility of the polycrystalline silicon thin film can be increased and the electric properties of the thin film transistor can be improved.

Figure 2:
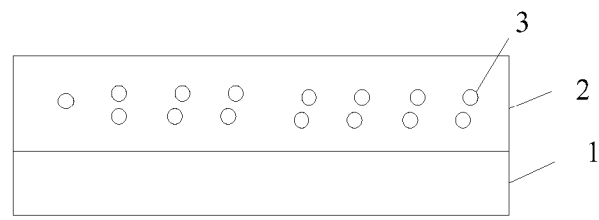
FIG. 2 is a schematic view illustrating that an amorphous silicon thin film is deposited on a substrate according to embodiments of the invention.
Figure 3:
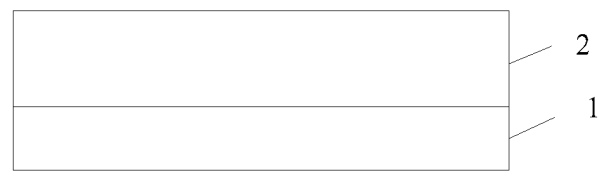
FIG. 3 is a schematic view illustrating that hydrogen is removed from the amorphous silicon thin film according to embodiments of the invention.
Figure 4:
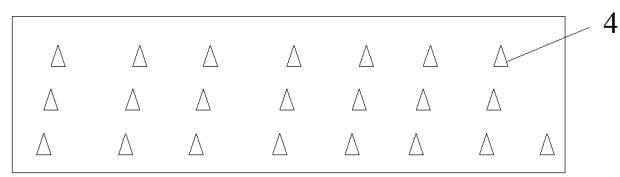
FIG. 4 is a schematic view illustrating crystal grains after performing a rapid thermal annealing process for several times according to embodiments of the invention.

Hereinafter, the manufacturing method of the low temperature polycrystalline silicon thin film according to the embodiment of the invention will be explained in detail in reference to FIG. 2-FIG. 4. As shown in FIG. 2-FIG. 4, the manufacturing method comprises the following steps.

S1: depositing the buffer layer on the substrate.

In an example, the substrate is the normal glass substrate. In an example, before the step S1 is performed, the substrate is cleaned so as to keep it clean.

For example, the buffer layer is a composite buffer layer made of a $SiN_x$ layer and a $SiO_2$ layer. In this case, the step S1 comprises: depositing the $SiN_x$ layer with a thickness of 50-150 nm (it should be noted that, the thickness can be selected according to the practical requirements) on the substrate by the PECVD method or other deposition methods; and depositing the $SiO_2$ layer with a thickness of 100-350 nm (it should be noted that, the thickness can be selected according to the practical requirements) by the PECVD method or other deposition methods. Thus, the composite buffer layer is formed on the substrate.

Alternatively, the buffer layer merely is the $SiO_2$ layer or the $SiN_x$ layer.

S2: depositing the amorphous silicon thin film on the buffer layer.

As shown in FIG. 2, the amorphous silicon thin film is deposited on the buffer layer by the PECVD method. For example, the amorphous silicon thin film has a thickness of 50 nm, and the thickness of the amorphous silicon thin film can be selected according to the practical requirements. For example, the step S2 is performed under the following conditions: the flow ratio of reaction gases is $SiH_4/H_2$=100-250 sccm/500-1250 sccm; the radio-frequency power is 80-120 W, the pressure in deposition chamber is 1800-2200 mtorr and the temperature is 380-400° C. In the step S2, the formed amorphous silicon thin film 2 contains hydrogen 3.

S3: performing the thermal treatment on the amorphous silicon thin film to remove hydrogen from the amorphous silicon thin film.

As shown in FIG. 3, hydrogen is removed from the amorphous silicon thin film. For example, the thermal treatment is performed on the amorphous silicon thin film for 1-2 hours under a temperature range of 400-500° C. For example, the thermal treatment is performed on the amorphous silicon thin film for 1.5 hours under 450° C. in an annealing furnace. By removing hydrogen from the amorphous silicon thin film, the adverse influence of hydrogen on the crystallization in the following rapid thermal annealing process can be avoided.

S4: performing the rapid thermal annealing process on the amorphous silicon thin film for several times under the predetermined temperature to form the low temperature polycrystalline silicon thin film, wherein the predetermined temperature is lower than the conventional RTA crystallization temperature.

For example, the rapid thermal annealing process is performed on the amorphous silicon thin film for at least three times under the temperature range of 600-670° C., wherein the rapid thermal annealing process at each time is performed for no more than 30 s and is followed by the cooling process to cool the substrate to the room temperature. As shown in FIG. 4, the reference number 4 represents the crystal grains of the low temperature polycrystalline silicon thin film that is formed in step S4. The manufacturing method of the low temperature polycrystalline silicon thin film according to the embodiment of the invention performs the rapid thermal annealing process on the amorphous silicon thin film for several time under the temperature lower than the conventional RTA crystallization temperature, so that the crystallization temperature can be reduced, the crystallization can be performed on the normal glass substrate and the manufacturing cost of the low temperature polycrystalline silicon thin film can be decreased. In addition, by performing the rapid thermal annealing processes for several times under the temperature lower than the conventional RTA crystallization temperature, the crystal grains of the polycrystalline silicon thin film becomes uniform and the internal stress of the polycrystalline silicon thin film is decreased, so that the crystal defect of the polycrystalline silicon thin film can be reduced and the mobility of the polycrystalline silicon thin film can be increased.

S5: performing the thermal treatment on the low temperature polycrystalline silicon thin film.

For example, the thermal treatment is performed on the low temperature polycrystalline silicon thin film for at least 3 hours under the temperature range of 400-500° C. For example, the thermal treatment is performed on the low temperature polycrystalline silicon thin film for 3 hours under 450° C.

Figure 5:
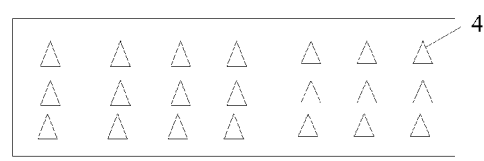
FIG. 5 is a schematic view illustrating that the crystal grains grow to have a large size according to embodiments of the invention.

After the crystal nucleuses are formed, the growth of the crystal grains can be promoted if the thermal treatment is performed on the low temperature polycrystalline silicon thin film. In this case, crystallization of the amorphous silicon thin film into the polycrystalline silicon thin film comprises two obvious stages: nucleation and growth, so that not only the crystal nucleuses can be uniformly formed, but also the crystal grains with large size can be obtained. As shown in FIG. 5, the polycrystalline silicon thin film in which the crystal grains have the size of about 200 nm is finally formed after the growth of the crystal grains 4. The increase of the size of the crystal grains can further improve the mobility of the polycrystalline silicon thin film and enhance the electric properties of the thin film transistor.

An embodiment of the invention provides a manufacturing method of a thin film transistor. The manufacturing method of the thin film transistor comprises the following steps.

Step 1: forming the buffer layer on the substrate.

For example, the buffer layer is the composite buffer layer made of the $SiN_x$ layer and the $SiO_2$ layer. For example, the $SiN_x$ layer with the thickness of 50-150 nm (it should be noted that, the thickness can be selected according to the practical requirements) is firstly deposited on the substrate by the PECVD method or other deposition methods, and then the $SiO_2$ layer with the thickness of 100-350 nm (it should be noted that, the thickness can be selected according to the practical requirements) is deposited by the PECVD method or other deposition methods. Thus, the composite buffer layer is formed on the substrate. Alternatively, the buffer layer merely is the $SiO_2$ layer or the $SiN_x$ layer.

Step 2: depositing the amorphous silicon thin film on the buffer layer.

The amorphous silicon thin film is deposited on the buffer layer by the PECVD method. For example, the amorphous silicon thin film has the thickness of 50 nm, and the thickness of the amorphous silicon thin film can be selected according to the practical requirements. For example, the step S2 is performed under the following conditions: the flow ratio of reaction gases is $SiH_4/H_2$=100-250 sccm/500-1250 sccm; the radio-frequency power is 80-120 W, the pressure in deposition chamber is 1800-2200 mtorr and the temperature is 380-400° C. In the step S2, the formed amorphous silicon thin film contains hydrogen.

Step 3: performing the rapid thermal annealing process on the amorphous silicon thin film for several times by a RTA equipment under the temperature lower than the conventional RTA crystallization temperature to form the low temperature polycrystalline silicon thin film, and patterning the low temperature polycrystalline silicon thin film to form an active layer comprising a source region, a drain region and a channel region.

For example, hydrogen in the amorphous silicon thin film is firstly removed. For example, the thermal treatment is performed on the amorphous silicon thin film for 1-2 hours under the temperature range of 400-500° C. so as to remove hydrogen from the amorphous silicon thin film. For example, the thermal treatment is performed on the amorphous silicon thin film for 1.5 hours under 450° C. in the annealing furnace. By removing hydrogen from the amorphous silicon thin film, the adverse influence of hydrogen on the crystallization in the following rapid thermal annealing process can be avoided.

Then, the rapid thermal annealing process is performed on the amorphous silicon thin film for at least three times under the temperature range of 600-670° C. to form the low temperature polycrystalline silicon thin film, wherein the rapid thermal annealing process at each time is performed for no more than 30 s and is followed by the cooling process to cool the substrate to the room temperature. Next, the thermal treatment is performed on the low temperature polycrystalline silicon thin film for at least 3 hours under the temperature range of 400-500° C.

Then, the low temperature polycrystalline silicon thin film is patterned by using a mask plate to form the active layer comprising the source region, the drain region and the channel region.

Step 4: forming a gate insulation layer on the channel region, and forming a gate electrode on the gate insulation layer.

For example, the $SiN_x$ layer or the $SiO_2$ layer is deposited on the channel region by the PECVD method or other deposition methods to form the gate insulation layer. For example, the gate electrode is formed on the gate insulation layer by a sputtering method.

Step 5: doping impurities into the source region and the drain region by an ion implantation method, and forming an interlayer insulation layer on the gate electrode.

For example, the $SiN_x$ layer or the $SiO_2$ layer is deposited on the gate electrode by the PECVD method or other deposition methods to form the interlayer insulation layer.

Step 6: forming a source electrode and a drain electrode on the substrate on which the interlayer insulation layer has been formed.

For example, the source electrode and the drain electrode are formed by the sputtering method on the substrate on which the interlayer insulation layer has been formed. The source electrode and the drain electrode are respectively connected to the source region and the drain region of the active layer through via holes penetrating through the interlayer insulation layer and the gate insulation layer.

The thin film transistor manufactured by the above-described method is of top-gate type. In addition, in the above-described manufacturing method of the thin film transistor, the method of forming the low temperature amorphous silicon thin film on the substrate is the same as the above-described manufacturing method of the low temperature polycrystalline silicon thin film.

Figure 6:
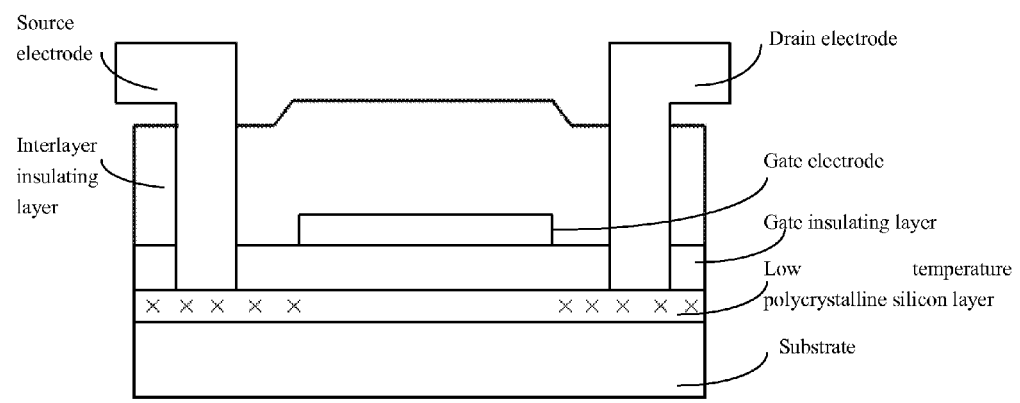
FIG. 6 is a structural schematic view illustrating a thin film transistor according to embodiments of the invention.

The thin film transistor manufactured by the above manufacturing method has a structure as shown in FIG. 6.

An embodiment of the invention further provides a manufacturing method of a thin film transistor. The method comprises the following steps.

Step 1: forming the buffer layer on the substrate.

For example, the buffer layer is the composite buffer layer made of the $SiN_x$ layer and the $SiO_2$ layer. For example, the $SiN_x$ layer with the thickness of 50-150 nm (it should be noted that, the thickness can be selected according to the practical requirements) is firstly deposited on the substrate by the PECVD method or other deposition methods, and then the $SiO_2$ layer with the thickness of 100-350 nm (it should be noted that, the thickness can be selected according to the practical requirements) is deposited by the PECVD method or other deposition methods. Thus, the composite buffer layer is formed on the substrate. Alternatively, the buffer layer merely is the $SiO_2$ layer or the $SiN_x$ layer.

Step 2: forming the gate electrode and the gate insulation layer on the buffer layer.

For example, the gate electrode is formed on the buffer layer by the sputtering method, and the $SiN_x$ layer or the $SiO_2$ layer is deposited by the PECVD method or other deposition methods to form the gate insulation layer. In some embodiments, since the gate insulation layer and the buffer layer are made from same materials, merely the gate insulation layer is formed before the formation of the amorphous silicon thin film, that is, the buffer layer is omitted.

S3: depositing the amorphous silicon thin film on the gate insulation layer.

The amorphous silicon thin film is deposited on the gate insulation layer by the PECVD method. For example, the amorphous silicon thin film has the thickness of 50 nm, and the thickness of the amorphous silicon thin film can be selected according to the practical requirements. For example, the step S3 is performed under the following conditions: the flow ratio of reaction gases is $SiH_4/H_2$=100-250 sccm/500-1250 sccm; the radio-frequency power is 80-120 W, the pressure in deposition chamber is 1800-2200 mtorr and the temperature is 380-400° C. In the step S3, the formed amorphous silicon thin film contains hydrogen.

Step 4: performing the rapid thermal annealing process on the amorphous silicon thin film for several times by the RTA equipment under the temperature lower than the conventional RTA crystallization temperature to form the low temperature polycrystalline silicon thin film, and patterning the low temperature polycrystalline silicon thin film to form the active layer comprising the source region, the drain region and the channel region.

For example, hydrogen in the amorphous silicon thin film is firstly removed. For example, the thermal treatment is performed on the amorphous silicon thin film for 1-2 hours under the temperature range of 400-500° C. so as to remove hydrogen from the amorphous silicon thin film. For example, the thermal treatment is performed on the amorphous silicon thin film for 1.5 hours under 450° C. in the annealing furnace. By removing hydrogen from the amorphous silicon thin film, the adverse influence of hydrogen on the crystallization in the following rapid thermal annealing process can be avoided.

Then, the rapid thermal annealing process is performed on the amorphous silicon thin film for at least three times under the temperature range of 600-670° C. to form the low temperature polycrystalline silicon thin film, wherein the rapid thermal annealing process at each time is performed for no more than 30 s and is followed by the cooling process to cool the substrate to the room temperature. Next, the thermal treatment is performed on the low temperature polycrystalline silicon thin film for at least 3 hours under the temperature range of 400-500° C.

Then, the low temperature polycrystalline silicon thin film is patterned by using the mask plate to form the active layer comprising the source region, the drain region and the channel region.

Step 5: doping impurities into the source region and the drain region by the ion implantation method, and forming the interlayer insulation layer on the active layer.

For example, the $SiN_x$ layer or the $SiO_2$ layer is deposited on the active layer by the PECVD method or other deposition methods to form the interlayer insulation layer.

Step 6: forming the source electrode and the drain electrode on the substrate on which the interlayer insulation layer has been formed.

For example, the source electrode and the drain electrode are formed by the sputtering method on the substrate on which the interlayer insulation layer has been formed. The source electrode and the drain electrode are respectively connected to the source region and the drain region of the active layer through via holes penetrating through the interlayer insulation layer.

The thin film transistor manufactured by the above-described method is of bottom-gate type. In addition, in the above-described manufacturing method of the thin film transistor, the method of forming the low temperature amorphous silicon thin film on the substrate is the same as the above-described manufacturing method of the low temperature polycrystalline silicon thin film.

Figure 7:
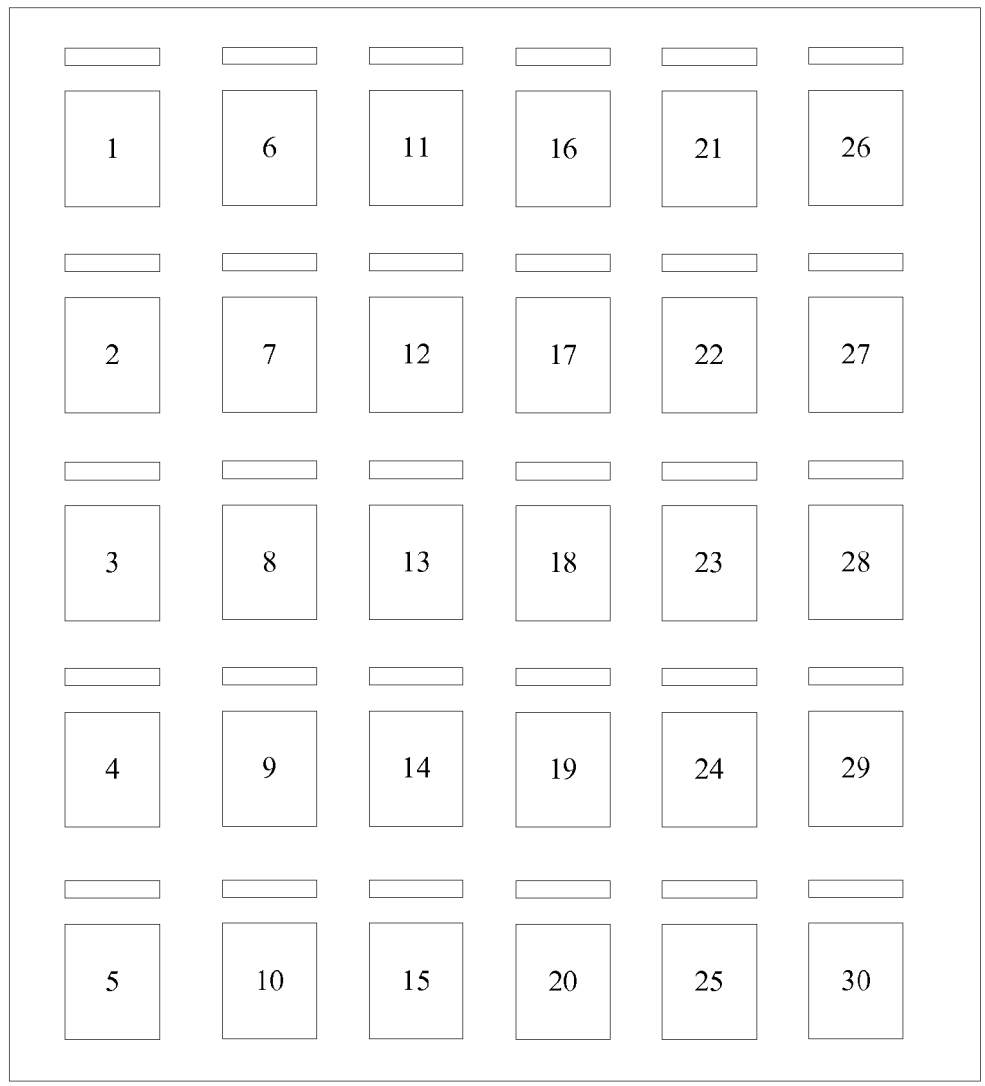
FIG. 7 is a schematic view illustrating that 30 display panels are formed on the substrate according to embodiments of the invention.
Figure 8:
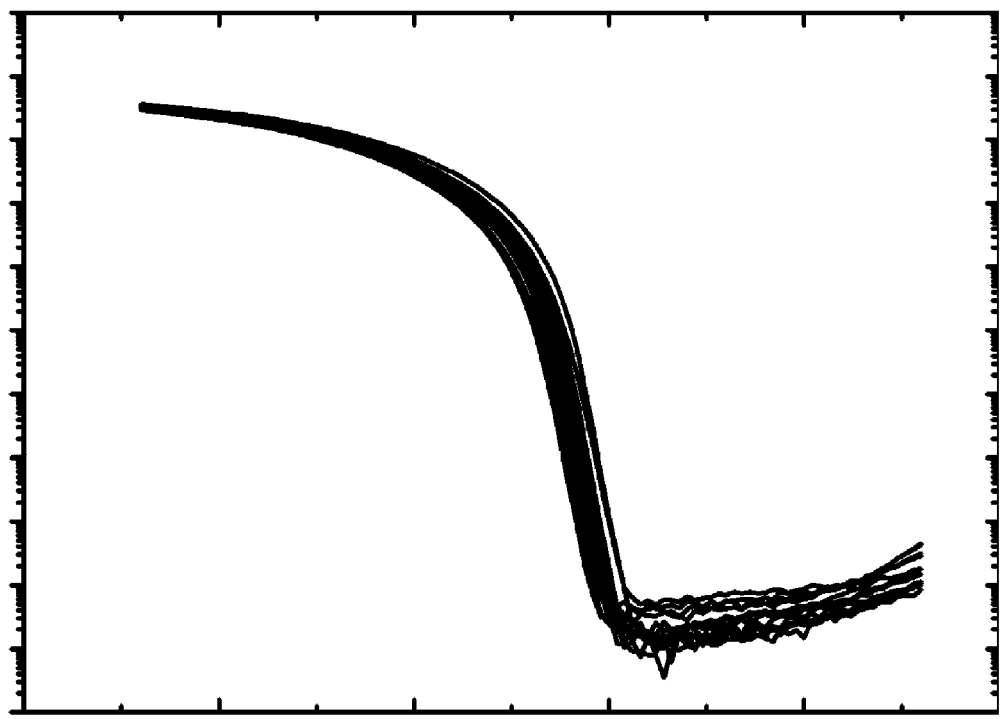
FIG. 8 is a schematic view illustrating an I-V characteristic of the thin film transistor according to embodiments of the invention.

As shown in FIG. 7, multiple display panels are formed on the substrate by using the manufacturing method of the thin film transistor according to the embodiments of the invention. For example, 30 display panels which are uniformly arranged are formed on the substrate, and 15 test points were taken from the entire substrate. For example, the 15 test points were respectively taken from the display panels numbered as 1, 3, 5, 7, 9, 11, 13, 15, 17, 19, 21, 23, 25, 27, 29, and the thin film transistor at each of the 15 test points was tested to obtain I-V characteristic of the thin film transistor shown in FIG. 8. As shown in FIG. 8, the transverse axis represents the gate voltage of the thin film transistor and the vertical axis represents the source-drain current of the thin film transistor. It can be seen from FIG. 8 that the I-V curves of the thin film transistors at the 15 test points have the same trend. Accordingly, the thin film transistors manufactured by the method according to the embodiments of the invention have uniform characteristics and are easy to be driven.

The foregoing embodiments merely are exemplary embodiments of the invention, and not intended to define the scope of the invention, and the scope of the invention is determined by the appended claims.

What is claimed is:

1. A manufacturing method of a low temperature polycrystalline silicon thin film, comprising:
    forming an amorphous silicon thin film on a substrate; and
    performing a first thermal treatment on the amorphous silicon thin film under a temperature range of 400-500° C.;
    performing a rapid thermal annealing (RTA) process on the amorphous silicon thin film for several times at a predetermined temperature followed by a cooling process to cool the substrate to a room temperature each cycle, so as to form the low temperature polycrystalline silicon thin film, wherein the predetermined temperature is lower than 750° C; and performing a second thermal treatment on the low temperature polycrystalline silicon thin film under a temperature range of 400-500° C. for at least 3 hours.

2. The manufacturing method of the low temperature polycrystalline silicon thin film according to claim 1, wherein the forming the amorphous silicon thin film on the substrate comprises:

forming a buffer layer on the substrate; and forming the amorphous silicon thin film on the buffer layer.

3. The manufacturing method of the low temperature polycrystalline silicon thin film according to claim 2, wherein before the forming the buffer layer on the substrate, the method further comprises: cleaning the substrate.

4. The manufacturing method of the low temperature polycrystalline silicon thin film according to claim 1, wherein the RTA process performed on the amorphous silicon thin film is under a temperature range of 600-670° C. for no more than 30 s.

5. The manufacturing method of the low temperature polycrystalline silicon thin film according to claim 4, wherein the first thermal treatment performed on the amorphous silicon thin film is lasted for 1-2 hours.

6. The manufacturing method of the low temperature polycrystalline silicon thin film according to claim 5, wherein the first thermal treatment is performed to remove hydrogen from the amorphous silicon thin film.

7. A manufacturing method of a thin film transistor, comprising:

forming a buffer layer on a substrate;

forming a low temperature polycrystalline silicon thin film on the buffer layer by using a method according to claim 1;

patterning the low temperature polycrystalline silicon thin film to form an active layer comprising a source region, a drain region and a channel region;

forming a gate insulation layer on the channel region, and forming a gate electrode on the gate insulation layer;

doping impurities into the source region and the drain region by an ion implantation method, and forming an interlayer insulation layer on the gate electrode; and forming a source electrode and a drain electrode on the substrate on which the interlayer insulation layer has been formed.

8. A manufacturing method of a thin film transistor, comprising:

forming a buffer layer on a substrate;

forming a gate electrode on the buffer layer, and forming a gate insulation layer on the gate electrode;

forming a low temperature polycrystalline silicon thin film on the gate insulation layer by using a method according to claim 1;

patterning the low temperature polycrystalline silicon thin film to form an active layer comprising a source region, a drain region and a channel region;

doping impurities into the source region and the drain region by an ion implantation method, and forming an interlayer insulation layer on the active layer; and forming a source electrode and a drain electrode on the substrate on which the interlayer insulation layer has been formed.

9. The manufacturing method of the low temperature polycrystalline silicon thin film according to claim 1, wherein before the forming the amorphous silicon thin film on the substrate, the method further comprises: cleaning the substrate.

10. The manufacturing method of the low temperature polycrystalline silicon thin film according to claim 1, wherein the first thermal treatment is performed to remove hydrogen from the amorphous silicon thin film.

11. The manufacturing method of the low temperature polycrystalline silicon thin film according to claim 1, wherein the second thermal treatment is performed so that a growth of crystal grains of the low temperature polycrystalline silicon thin film is promoted.

* * * * *